(12) United States Patent
Chu et al.

(10) Patent No.: US 8,937,386 B2
(45) Date of Patent: Jan. 20, 2015

(54) CHIP PACKAGE STRUCTURE WITH ENIG PLATING

(75) Inventors: Tse-Ming Chu, Taipei (TW); Sung-Chuan Ma, Tai Po (HK)

(73) Assignee: Aflash Technology Co., Ltd., Taoyuan County (TW)

( * ) Notice: Subject to any disclaimer, the term of this patent is extended or adjusted under 35 U.S.C. 154(b) by 0 days.

(21) Appl. No.: 13/414,461

(22) Filed: Mar. 7, 2012

(65) Prior Publication Data

US 2012/0196438 A1      Aug. 2, 2012

Related U.S. Application Data

(62) Division of application No. 12/628,593, filed on Dec. 1, 2009, now abandoned.

(30) Foreign Application Priority Data

Dec. 2, 2008   (TW) .............................. 097146834 A

(51) Int. Cl.
*H01L 21/00* (2006.01)
*H01L 23/00* (2006.01)

(52) U.S. Cl.
CPC ....... *H01L 24/11* (2013.01); *H01L 2224/13099* (2013.01); *H01L 2224/16* (2013.01); *H01L 2924/01047* (2013.01); *H01L 2924/01078* (2013.01); *H01L 2924/01079* (2013.01); *H01L 2924/01082* (2013.01); *H01L 2224/05548* (2013.01); *H01L 2224/13022* (2013.01); *H01L 2924/01006* (2013.01); *H01L 2924/01033* (2013.01); *H01L 2924/014* (2013.01)

USPC .............. 257/737; 257/E23.01; 257/E23.068; 257/E21.508; 438/125; 438/614

(58) Field of Classification Search
USPC ............. 257/737, E23.01, E23.068, E21.508; 438/125, 614

See application file for complete search history.

(56) References Cited

U.S. PATENT DOCUMENTS

| | | | | |
|---|---|---|---|---|
| 4,736,521 | A * | 4/1988 | Dohya | 29/830 |
| 5,990,546 | A | 11/1999 | Igarashi et al. | |
| 6,075,712 | A | 6/2000 | McMahon | |
| 6,114,754 | A | 9/2000 | Kata | |
| 6,143,991 | A | 11/2000 | Moriyama | |
| 6,239,488 | B1 | 5/2001 | Chen | |
| 2004/0232543 | A1 * | 11/2004 | Goller et al. | 257/700 |
| 2006/0138671 | A1 * | 6/2006 | Watanabe | 257/773 |

* cited by examiner

*Primary Examiner* — Matthew Gordon
(74) *Attorney, Agent, or Firm* — Muncy, Geissler, Olds & Lowe, P.C.

(57) ABSTRACT

The formation of the conductive wire of a chip package consists of a plurality of steps. Coat a first dielectric layer on the pad-mounting surface and a slot is formed on each bonding pad correspondingly. Then coat a second dielectric layer and produce a wiring slot corresponding to each bonding pad and the slot thereof. Next each wiring slot is filled with electrically conductive metal so as to form a conductive wire. Later Coat a third dielectric layer and a corresponding slot is formed on one end of each conductive wire while this slot is filled with electrically conductive metal to form a solder point. The above steps can further be repeated so as to form an upper-layer and a lower-layer conductive wire. Thereby precision of the chip package, use efficiency of the wafer and yield rate of manufacturing processes are all improved.

6 Claims, 11 Drawing Sheets

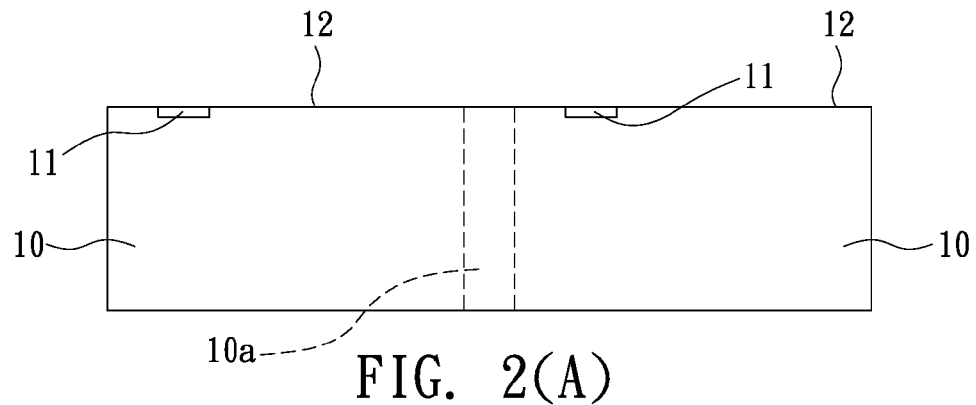
FIG. 2(A)
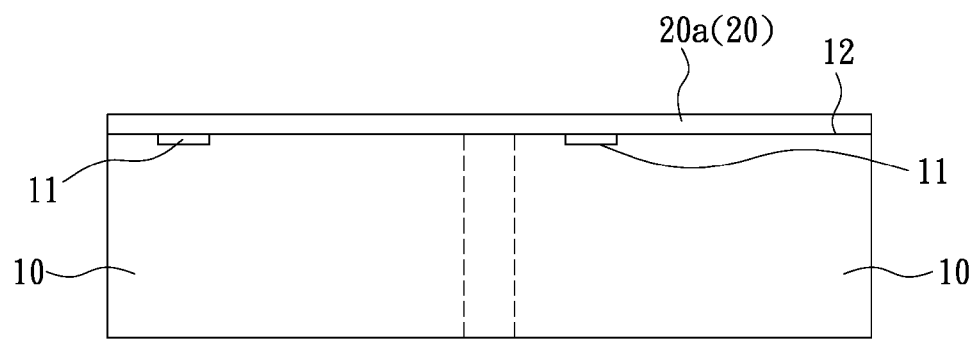
FIG. 2(B)
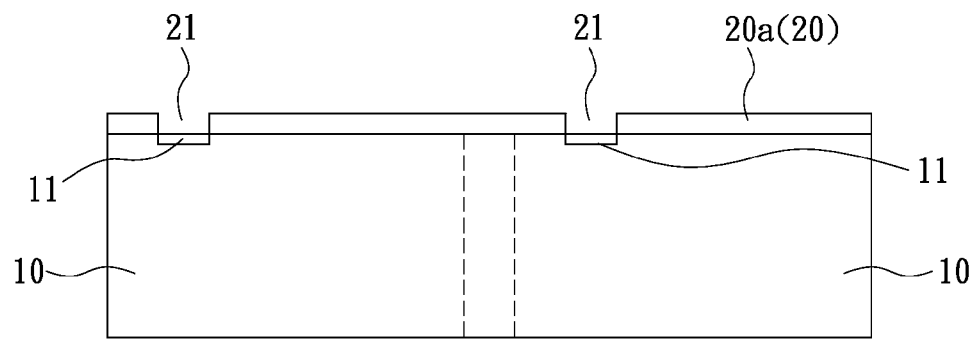
FIG. 2(C)

CHIP PACKAGE STRUCTURE WITH ENIG PLATING

CROSS REFERENCE TO RELATED APPLICATIONS

This application is a Divisional of application Ser. No. 12/628,593, filed on Dec. 1, 2009 now abandoned, for which priority is claimed under 35 U.S.C. §120; and this application claims priority of Application No. 097146834 filed in Taiwan, R.O.C. on Dec. 2, 2008 under 35 U.S.C. §119, the entire contents of all of which are hereby incorporated by reference.

BACKGROUND OF THE INVENTION

1. Fields of the Invention

The preset invention relates to a chip package structure, especially to a die with a plurality of bonding pads. Each bonding pad includes a conductive wire extended outward and a solder point. The die is electrically connected and assembled with a substrate by each conductive wire and each solder point.

2. Descriptions of Related Art

Along with development of semiconductor manufacturing processes, there are various manufacturing processes and structures of the chip package, as shown in U.S. Pat. Nos. 6,239,488, 5,990,546, 6,143,991, 6,075,712, and 6,114,754. In early days, a TAB (Tape automated bonding) technique is developed and used. But outer lead portions extended from the pad-mounting surface of the plurality of bonding die pads causes the increased package size and this is not satisfied with the requirement of high density. In recent years, a CSP (chip scale package) technique is developed and used. A plurality of various manufacturing processes and structure have also been derived. Although CSP solves the problem of larger package size caused by TAB, it still has problems of complicated manufacturing processes, low yield rate of the products and increased manufacturing cost. Refer to claim 1, claim 6, FIG. 1 to FIG. 7 and FIG. 14 to FIG. 19 in U.S. Pat. No. 6,239,488, conductive bodies 3 are directly formed on a pad-mounting surface 10 and there is no dielectric layer between the conductive bodies 3 and the pad-mounting surface 10. This has negative effect on the insulation effect between the conductive bodies 3 and other bonding pads and the product yield rate is reduced. Moreover, according to the processes and structure revealed by this prior art, the step that produces the conductive body 3 can't be repeated so that the conductive body 3 is with only single-layer structure, not double-layer structure. Thus the space on the pad-mounting surface 10 for establishing the required electrical connection is also reduced.

However, according to the structure and manufacturing processes mentioned in U.S. Pat. No. 6,239,488, the step of forming the conductive body 3 is unable to be repeated so that the conductive body 3 only has a single-layer structure. Thus the use efficiency of the wiring space on the pad-mounting surface 10 of a die is further reduced. Moreover, this prior art also restricts the formation method of the conductive body 3 in the chip package structure and the technique revealed by the steps in the claim 1 intends to make greater difference than other prior techniques disclosed in U.S. Pat. Nos. 5,990,546, 6,143,991, 6,075,712, and 6,114,754. However, the not only the scope of the claim is limited, but the formation and the structure of the conductive body 3 are complicated that lead to increased manufacturing cost. Thus there is a need to improve the chip package structure and the related manufacturing processes.

SUMMARY OF THE INVENTION

Therefore it is a primary object of the present invention to provide a single-layer chip package structure that improves precision of a semiconductor chip package and use efficiency of a wiring space on a pad-mounting surface of a die so as to increase use efficiency of the wafer and yield rate of the packaging process.

It is another object of the present invention to provide a double-layer chip package structure that improves precision of a semiconductor chip package and use efficiency of a wiring space on a pad-mounting surface of a die so as to increase use efficiency of the wafer and yield rate of the packaging process.

In order to achieve above objects, a chip package structure of the present invention includes a die and a plurality of bonding pads arranged above the die. A conductive wire and a solder point is formed on the bonding pad so that the die is electrically connected with and assembled on a substrate by each conductive wire and respective solder point. The formation of the conductive wire includes the steps of: firstly coat a first dielectric layer on the pad-mounting surface of the die and produce a corresponding slot on each bonding pad by exposure and development of photoresist materials. Then coat a second dielectric layer again and form a wiring slot on each bonding pad and the slot thereof correspondingly by exposure and development of photoresist materials. Next fill each wiring slot with electrically conductive metal by various conventional ways so as to form a conductive wire respectively. The conventional ways include metal paste (such as silver paste) printing, sputter, chemical vapor deposition (CVD), sputtering and electroplating, or CVD and electroplating, etc. Later coat a third dielectric layer and form a corresponding slot on one end of each conductive wire by exposure and development of photoresist materials. The slot is filled with electrically conductive metal so as to form a solder point exposed outside the outermost dielectric layer. Thus the bonding pad of the die is electrically extended to each solder point by each conductive wire and is electrically connected with each solder point preset on a substrate by the solder point so as to assembled and connect the die with the substrate.

In order to achieve above objects, a chip package structure of the present invention in which a die is electrically connected with and assembled on a substrate by each conductive wire and respective solder point. Similar to above steps, the steps of the formation of the conductive wire are repeated so as to further form an upper-layer conductive wire over the above conductive wire. The formation steps include: coat a third dielectric layer and form a corresponding slot on one end of each conductive wire (here is used as a lower-layer conductive wire) by exposure and development of photoresist materials. Then coat a fourth dielectric layer and form a wiring slot (used as an upper-layer wiring slot) on the slot disposed on one end of the lower-layer conductive wire correspondingly by exposure and development of photoresist materials. Then fill the upper-layer wiring slot with electrically conductive metal by various conventional ways so as to form a conductive wire respectively. The conventional ways include metal paste (such as silver paste) printing, sputter, chemical vapor deposition (CVD), sputtering and electroplating, or CVD and electroplating, etc. Later coat a fifth dielectric layer and form a corresponding slot on one end of each conductive wire by exposure and development of photoresist materials. The slot is filled with electrically conductive metal so as to form a solder point exposed outside the outermost dielectric layer. Thus the bonding pad on the pad-mounting surface of the die is electrically extended to each solder point by each conductive wire and is electrically connected with each solder point preset on a substrate by the solder point so as to assembled and connect the die with the substrate.

BRIEF DESCRIPTION OF THE DRAWINGS

FIG. 2A to FIG. 2L are schematic drawings showing manufacturing processes of the embodiment in FIG. 1 according to the present invention;

DETAILED DESCRIPTION OF THE PREFERRED EMBODIMENTS

Embodiment One

Figure 1:
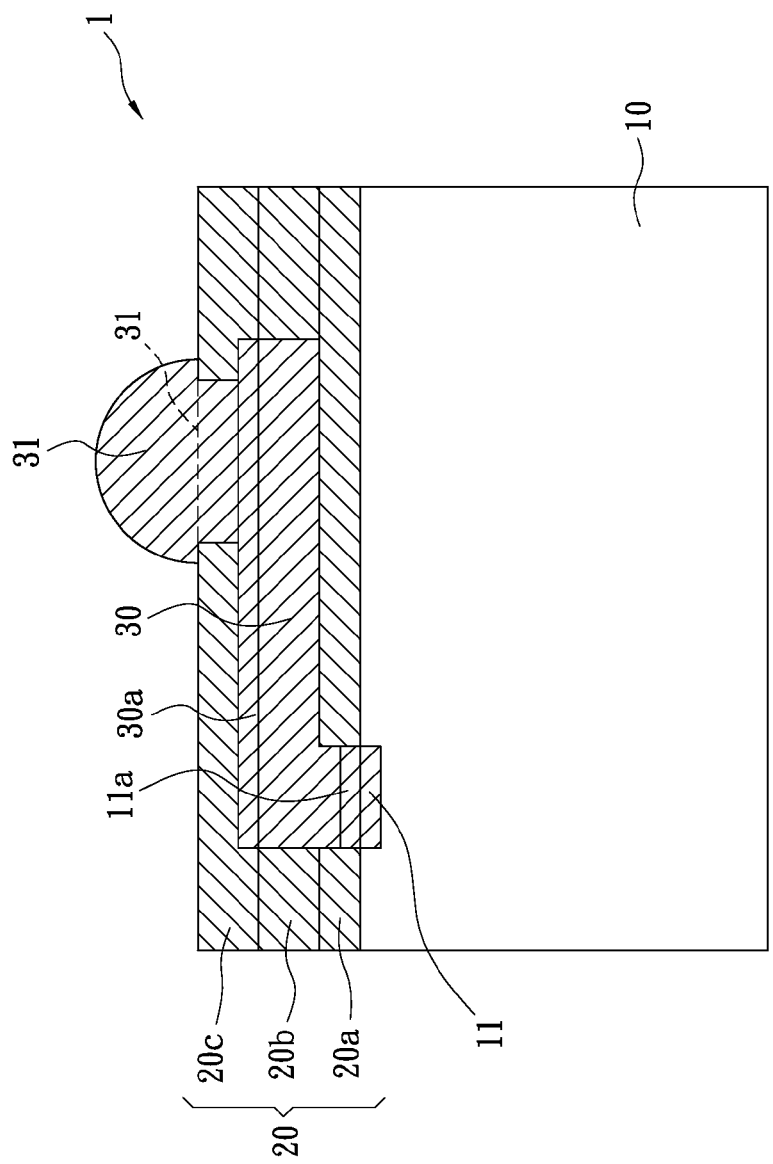
FIG. 1 is a cross sectional view of an embodiment with a single-layer conductive wire according to the present invention.

Refer to FIG. 1, FIG. 2A to FIG. 2L, a chip package of the present invention includes a die 10, a pad-mounting surface 12 disposed with a plurality of bonding pads 11 and arranged at the die 10, at least one dielectric layer 20 covered over the pad-mounting surface 12, and at least one conductive wire 30 set in the dielectric layer 20. One end of the conductive wire 30 is electrically connected with one bonding pad 11 on the die 10 while the other end thereof extends outwards and exposes outside the dielectric layer 20 to form a solder point 31, which is electrically connected with a solder point preset on a substrate (not shown in figure). Thus the die 10 is set on and connected with the substrate. Generally, if there are a number N of bonding pads 11 on the pad-mounting surface 12 of the die 10, there is a number N of separated conductive wires 30 disposed and formed on the dielectric layer 20. Thus one end of these conductive wires 30 is electrically connected with a bonding pad 11 on the die 10 while the other end thereof extends outward and exposes outside the outer surface of the dielectric layer 20 to form a number N of solder points 31, separating from one another and electrically connected with a number N of solder points 31 preset on a substrate.

Refer to FIG. 2, manufacturing processes of the chip package 1 according to the present invention, especially formation of the conductive wire 30 include following steps:

Refer to FIG. 2A, two adjacent dies 10 on a wafer is used as an example. A saw street 10a is disposed between the two adjacent dies 10, as dotted lines shown on the center of the figure. Moreover, each die 10 is disposed with a plurality of bonding pads (electrode) 11. In the figure, there is one bonding pad 11 on each die 10. The number of the bonding pad 11 is not limited. The bonding pad 11 is projected from or parallel to (as shown in figure) the pad-mounting surface 12 of the die 10, but not only limited to these arrangements.

As shown in FIG. 2B, firstly a dielectric layer 20a is coated on the pad-mounting surface 12 of the die 10. This is a part of the dielectric layer 20 in the chip package of the present invention. In order to distinguish them, this layer is called a first dielectric layer 20a. The coating way is spin coating but not limiting.

As shown in FIG. 2C, by exposure and development of photoresist materials such as epoxy or other resins, a slot 21 is formed on the first dielectric layer 20a and is corresponding to each bonding pad 11 on the pad-mounting surface 12 so that each bonding pad 11 is exposed.

Figure 2D:
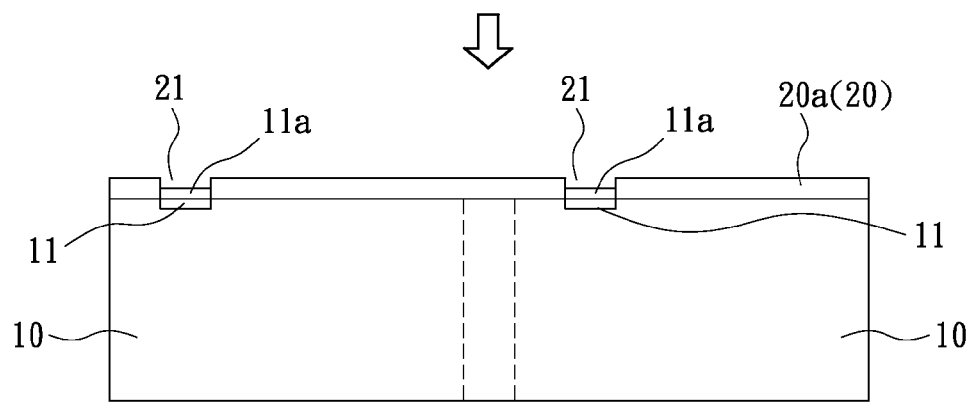

Refer to FIG. 2D, the exposed bonding pad 11 in the slot 21 is coated with an electrically conductive metal layer such as nickel-gold materials etc. by Electroless Nickel/Immersion Gold (ENIG) plating. The metal layer is used as a protective layer 11a and also an electrically conductive layer.

Figure 2E:
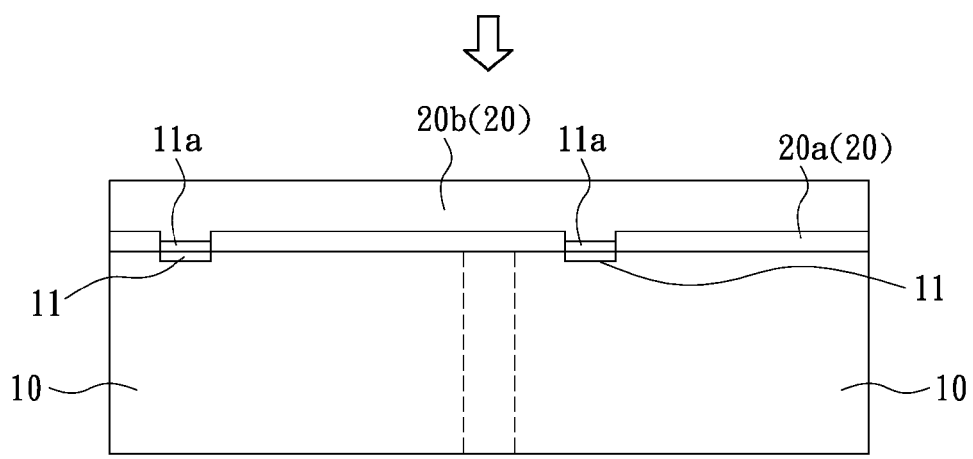

Refer to FIG. 2E, both the first dielectric layer 20a and the protective layer 11a of each bonding pad 11 are coated with an dielectric layer 20b which is also a part of the dielectric layer 20 and is called a second dielectric layer 20b. The coating way is spin coating but not limiting.

Figure 2F:
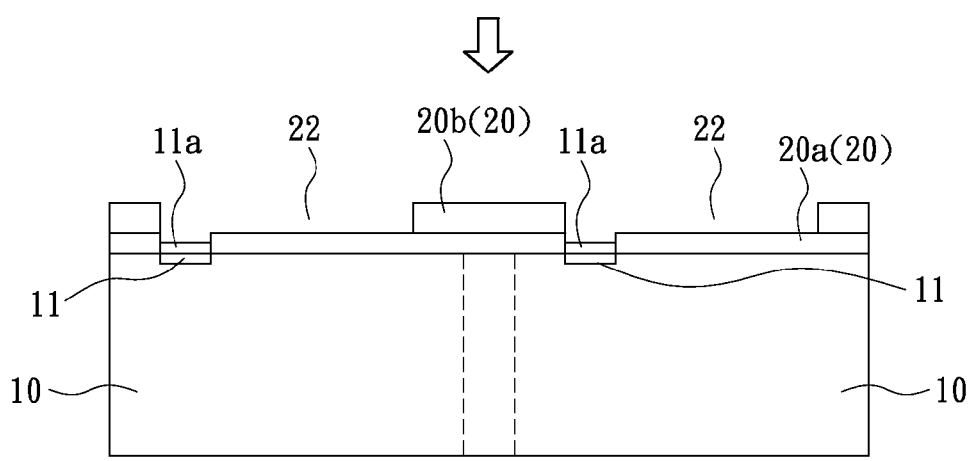

Refer to FIG. 2F, by exposure and development of photoresist materials such as epoxy or other resins, a wiring slot 22 connected with each bonding pad 11 and the slot 21 thereof is formed on the second dielectric layer 20b. Each wiring slot 22 is set concavely inside the second dielectric layer 20b and a top opening of the wiring slot 22 is parallel to the surface of the second dielectric layer 20b.

Figure 2G:
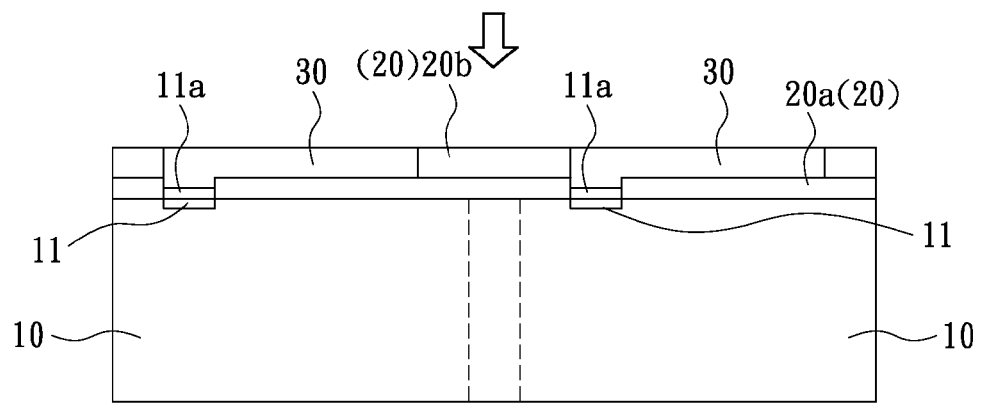

As shown in FIG. 2G, each wiring slot 22 is filled with electrically conductive metal by various conventional ways so as to form a respective conductive wire 30. The conventional ways include metal paste (such as silver paste) printing, sputter, chemical vapor deposition, sputtering and electroplating, or CVD and electroplating, etc. The wiring slot 22 is set concavely inside the second dielectric layer 20b and the top opening of the wiring slot 22 is parallel to the surface of the second dielectric layer 20b. Thus while filling electrically conductive metal such as silver paste into each wiring slot 22, the electrically conductive metal over the surface of the second dielectric layer 20b is removed by a processing operation such as grinding so as to make the surface of the conductive wire 30 formed and the surface of the second dielectric layer 20b are at the same level.

Figure 2H:
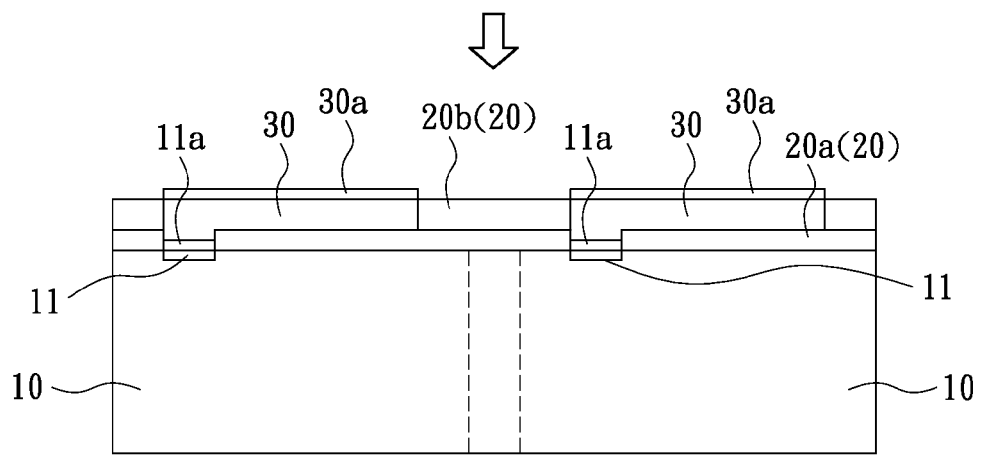

Refer to FIG. 2H, each conductive wire 30 is coated with an electrically conductive metal layer such as nickel silver materials by Electroless Nickel/Immersion Gold (ENIG) plating. The metal layer is used as a protective layer 30a of each conductive wire 30 and also an electrically conductive layer. This step is similar to the step of forming the protective layer 11a in FIG. 2D.

Figure 2I:
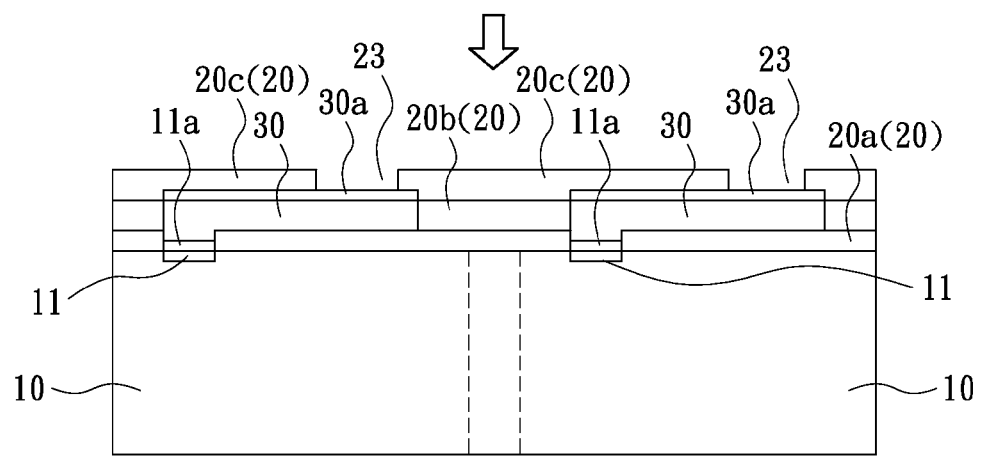

Refer to FIG. 2I, the second dielectric layer 20b and each conductive wire 30 (protective layer 30a) are coated with an dielectric layer 20c which is also a part of the dielectric layer 20 and is called a third dielectric layer 20c. The coating way is spin coating but not limiting. Then by exposure and development of photoresist materials such as epoxy or other resins, a slot 23 connected with one end of each conductive wire 30 (protective layer 30a) correspondingly is formed on the third dielectric layer 20c. This step is similar to the steps in FIG. 2E and FIG. 2F.

Figure 2J:
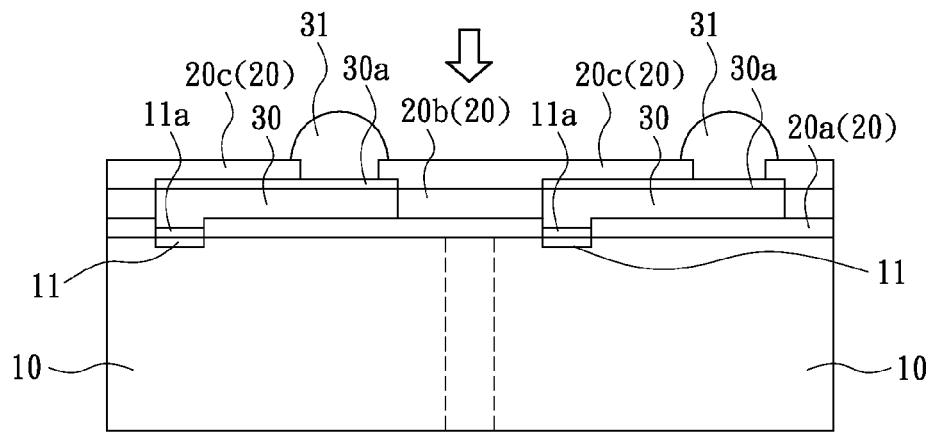

Refer to FIG. 2J, each slot 23 is filled with electrically conductive metal by various conventional ways so as to form a respective solder point 31, exposed outside the dielectric layer 20 (third dielectric layer 20c). The solder point 31 exposed outside the dielectric layer 20 is electrically connected with bonding pads 11 of the die 10. The above conventional ways consist of silver paste printing, sputter, chemical vapor deposition, sputtering and electroplating, or CVD and electroplating, etc. Each solder point 31 together with the conductive wire 30 connected forms a conductive wiring on the pad-mounting surface 12 of the die 10 of the chip package 1. On end of each conductive wire 30 is electrically connected with one bonding pad 11 on the die 10 while the other end thereof extends outwards and exposes outside the dielectric layer 20 to form a solder point 31. Thus each solder point 31 exposed outside the dielectric layer 20 (the third dielectric layer 20c) is electrically connected with both each bonding pad 11 on the die 10 and a solder point preset on a substrate (not shown in figure) so as to assemble and fix the die 10 on the substrate. Moreover, the shape of the solder point 31 is hemispheric but not limiting, projecting out of the outer surface of the third dielectric layer 20c, as shown in FIG. 2J or the dotted line in FIG. 1. The shape of the solder point 31 is not limited, depending on the corresponding solder point of the substrate.

Figure 2K:
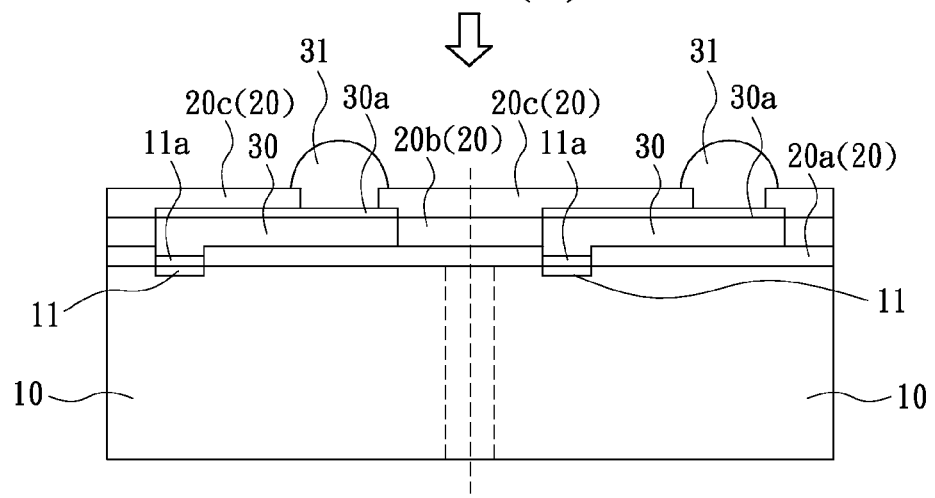
Figure 2L:
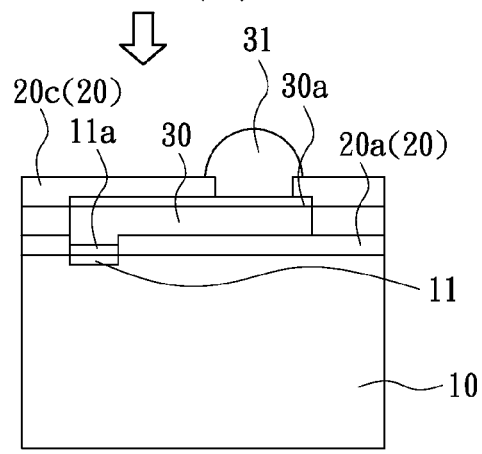

Refer to FIG. 2K, as dotted lines in the center of the figure indicated, along the saw street 10a, the two adjacent dies 10 are divided to form a respective die 10 having a chip package structure of the present invention, as shown in FIG. 2L or FIG. 1.

Refer to FIG. 1, FIG. 2A to FIG. 2L, when there is a number N of bonding pad 11 on the pad-mounting surface 12 of the die 10, the dielectric layer 20 is disposed with a number N of separated conductive wires 30. One end of each conductive wire 30 is electrically connected with a bonding pad 11 of the die 10 while the other end thereof extends outward and exposes outside the outer surface of the dielectric layer 20 to form a number N of solder points 31, separating from one another and electrically connected with a number N of solder points 31 preset on a substrate (not shown in figure). In this embodiment, the dielectric layer 20 is formed by the first dielectric layer 20a, the second dielectric layer 20b and the third dielectric layer 20c. The thickness of each of these dielectric layers is not limited and is set according to requirements of the structure or requirements of the manufacturing equipment. Moreover, each conductive wire 30 such as the number N conductive wires 30 is disposed on the dielectric layer 20 at the same level, as shown in FIG. 2G That means each conductive wire 30 is located at the same height. Thus such design is considered as a single-layer conductive wire 30 structure.

The manufacturing processes of the chip package structure of the present invention, especially formation steps of each conductive wire 30, can achieve a certain precision significantly. Thus the use of the wiring space on the pad-mounting surface of the die (chip) is improved effectively. Therefore, the use efficiency of the wafer is further increased and the yield rate of the packaging process is dramatically improved.

Embodiment Two

Figure 3:
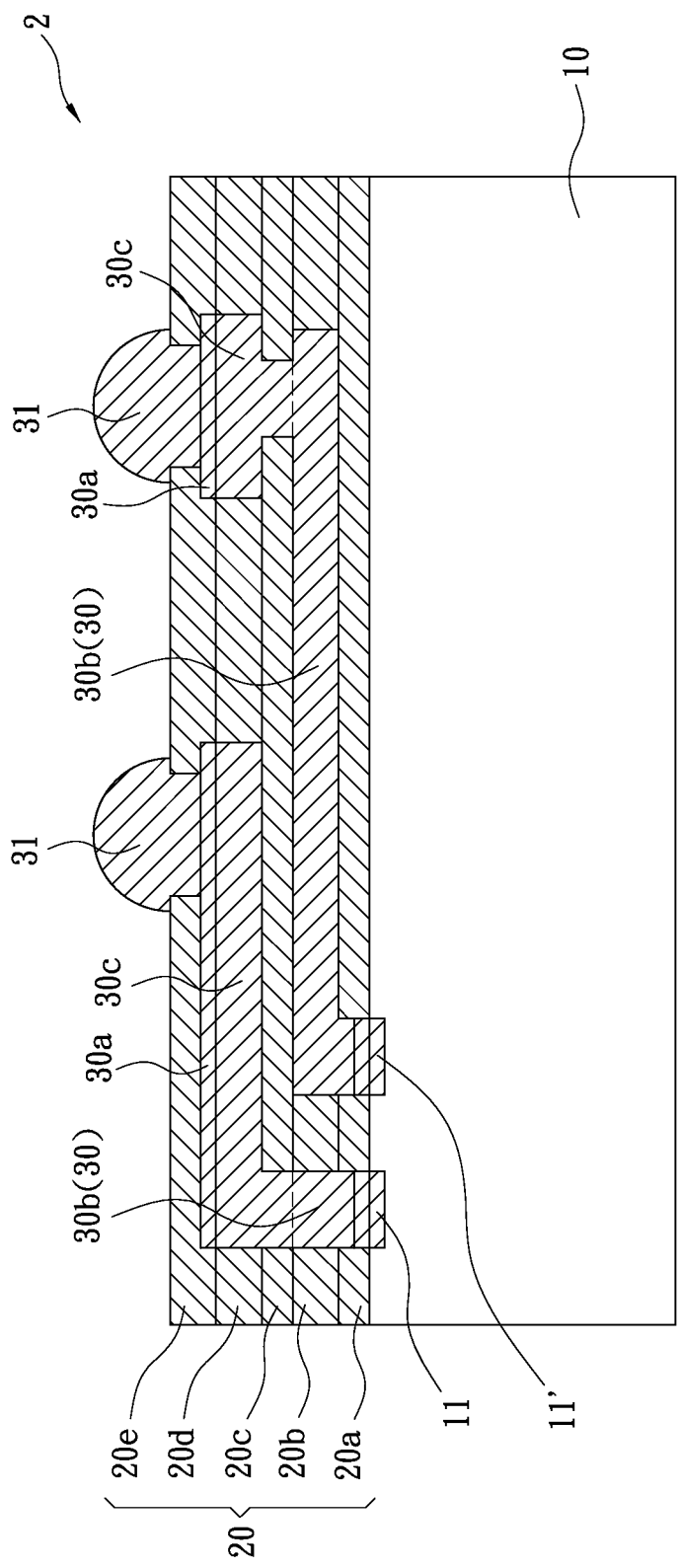
FIG. 3 is a cross sectional view of an embodiment with a double-layer conductive wire according to the present invention.
Figure 4A:
FIG. 4A to FIG. 4N are schematic drawings showing manufacturing processes of the embodiment in FIG. 3 according to the present invention.
Figure 4B:
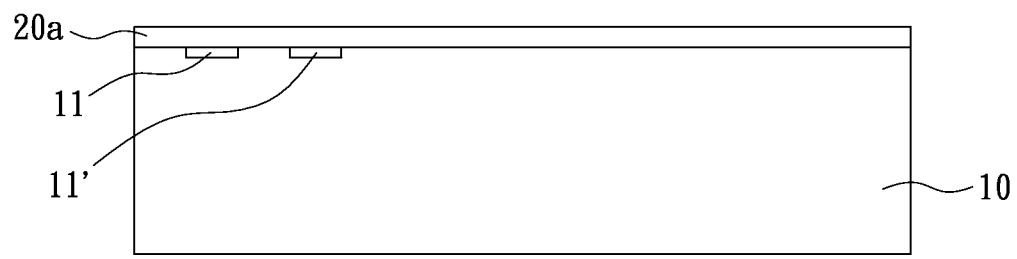
Figure 4C:
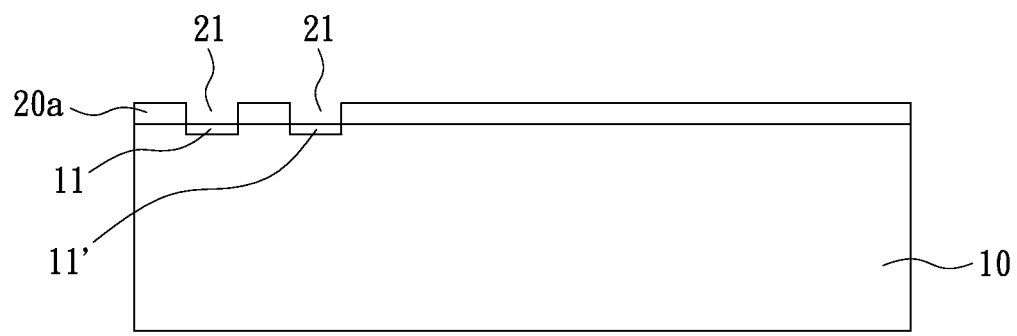
Figure 4D:
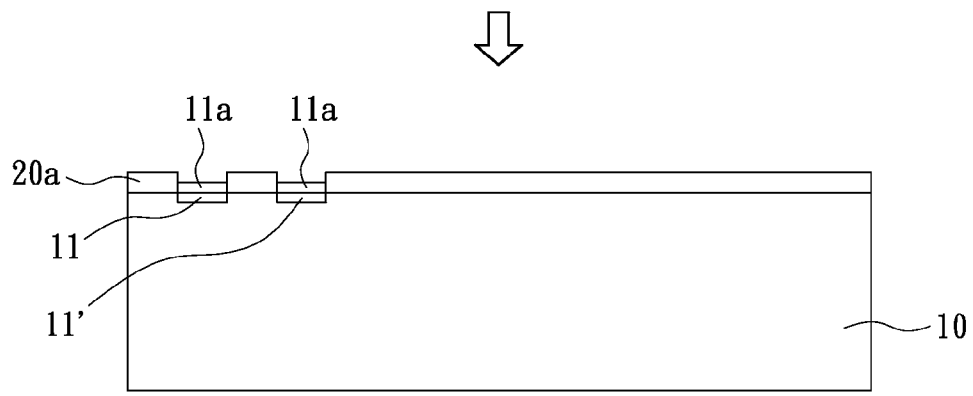
Figure 4E:
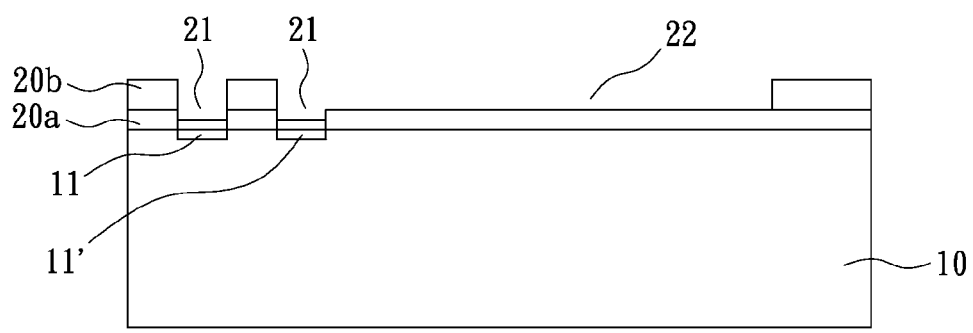
Figure 4F:
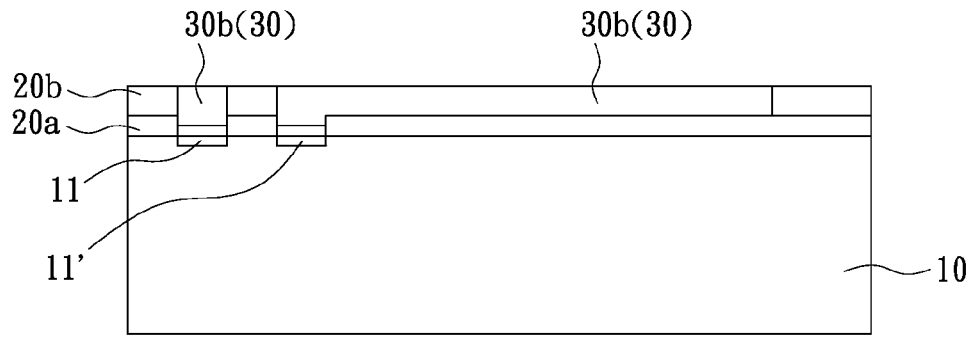
Figure 4G:
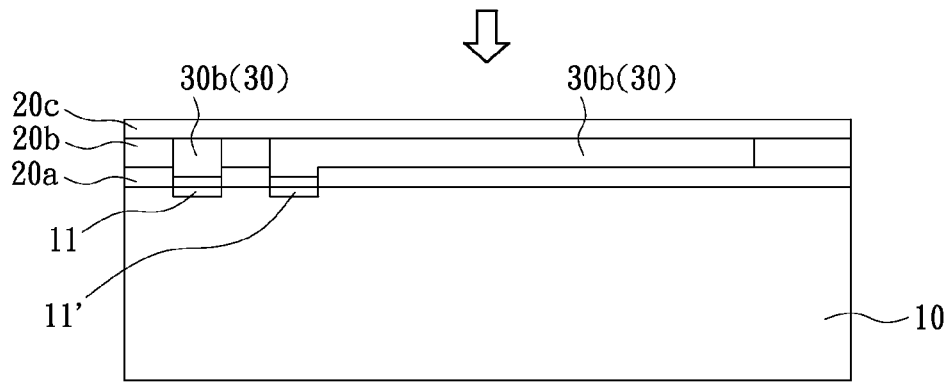
Figure 4H:
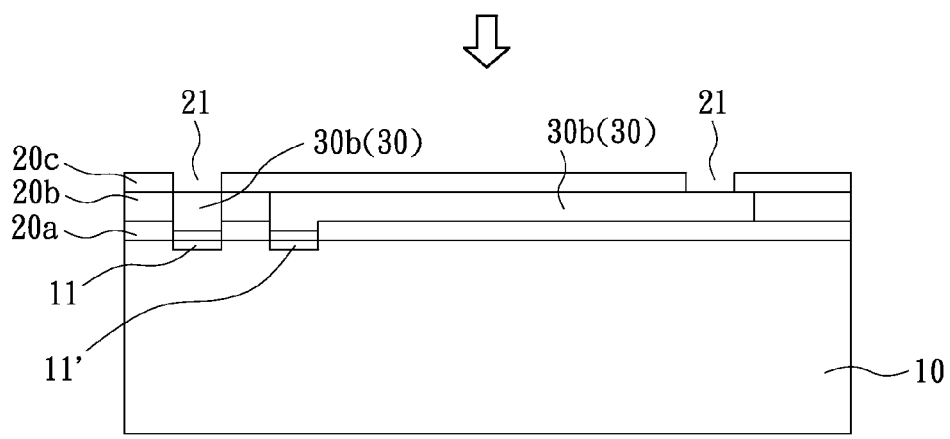
Figure 4I:
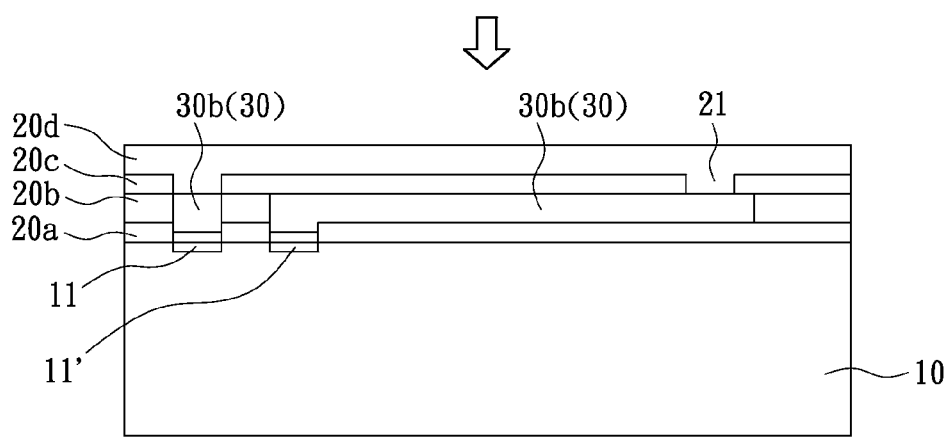
Figure 4J:
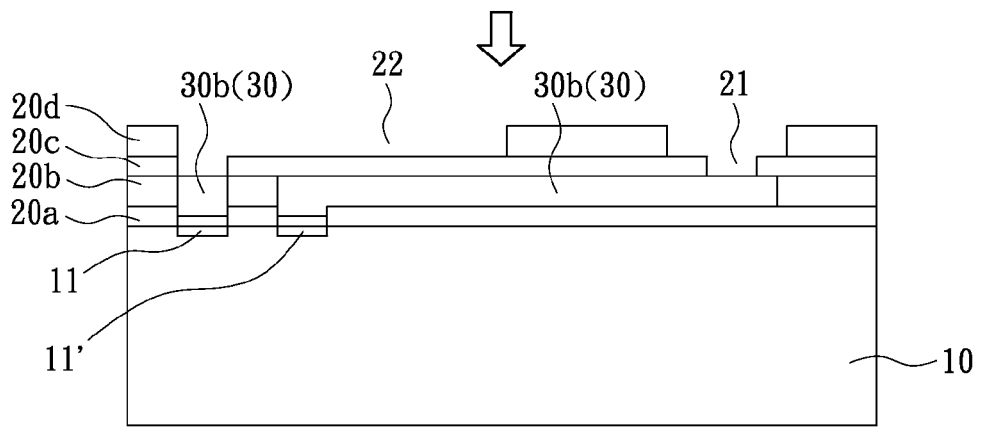
Figure 4K:
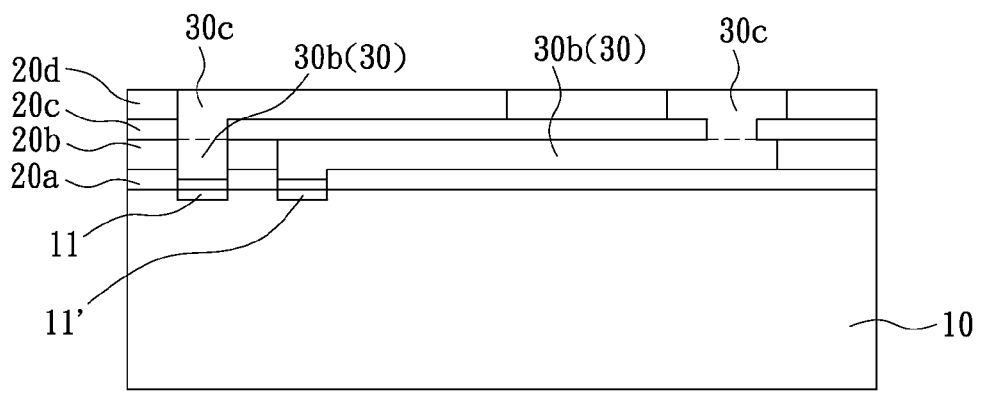
Figure 4L:
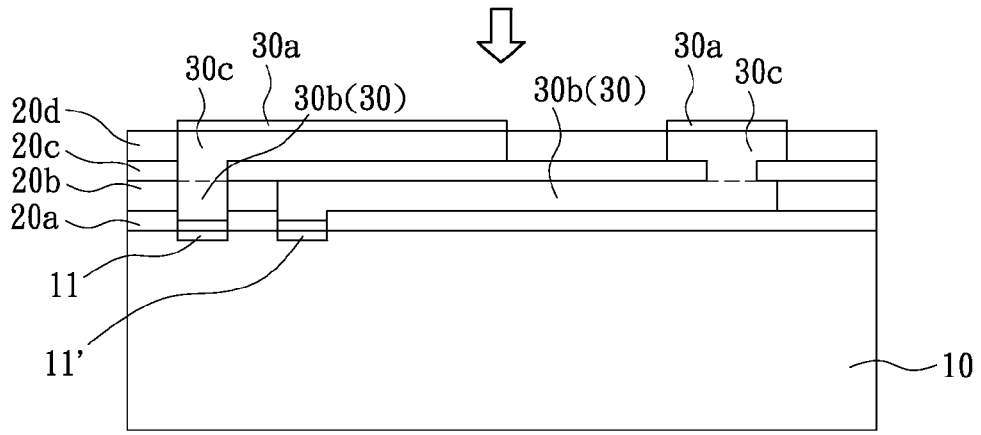
Figure 4M:
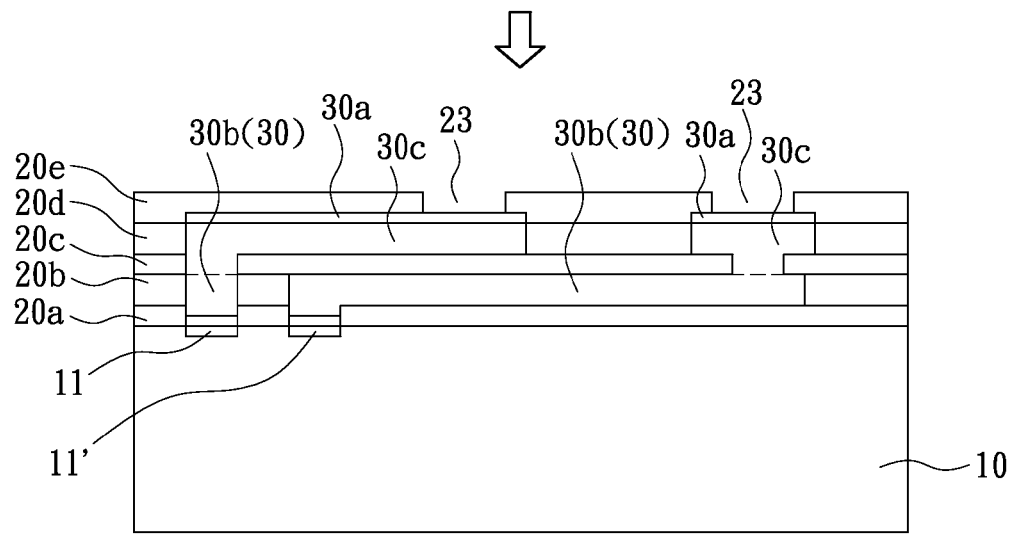
Figure 4N:
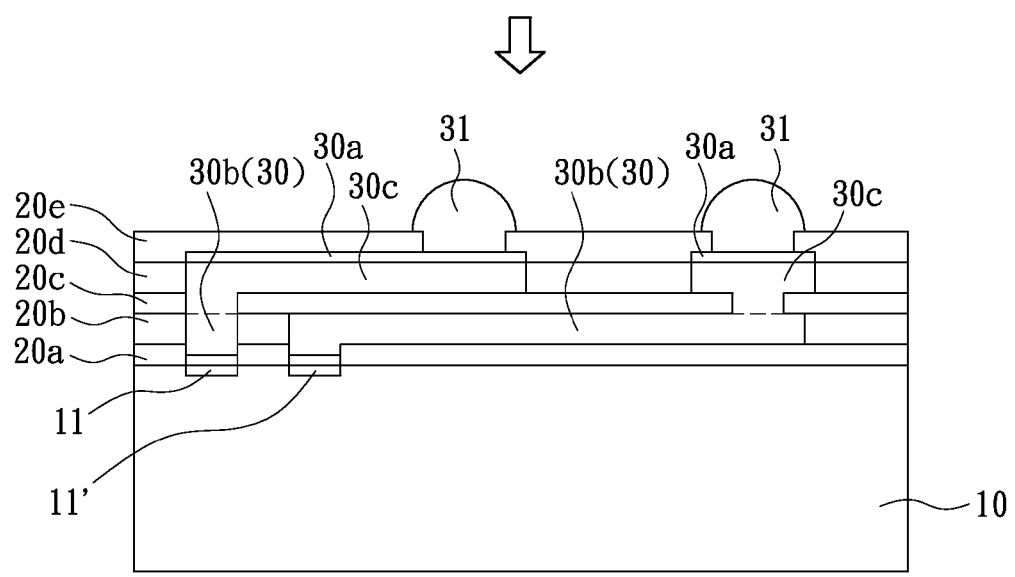

Refer to FIG. 3, FIG. 4A to FIG. 4N, the difference between a chip package 2 of this embodiment and the above one is in that the above embodiment includes a single-layer conductive wire 30. That means each conductive wire 30 such as a number N of conductive wires 30 is disposed on the dielectric layer 20 at the same level. Thus such design is considered as a single-layer structure of the conductive wire 30. In this embodiment, the conductive wire 30 is double-layer. That means conductive wires 30 such as a number N of conductive wires 30 are disposed on the dielectric layer 20 at different levels, a lower layer and an upper layer 30b, 30c, as shown in FIG. 3 and FIG. 4N. Thus this embodiment is considered as a double-layer structure. The present embodiment with double-layer conductive wire 30 (30b, 30c) has an advantage in that: while arranged a number N of separated (insulated) conductive wires 30 on the dielectric layer 20, when the surface area of the pad-mounting surface 12 is too small or the manufacturing processes and equipment are unable to meet manufacturing requirements, part of the N conductive wires 30 (such as a number N/2 of conductive wires 30) is arranged at a horizontal position (the same level) of the dielectric layer 20 to form a layer of conductive wire 30 and this layer is called a lower-layer conductive wire 30b. Then the rest part of the N conductive wires 30 (the rest N/2 conductive wires 30) is disposed on the dielectric layer 2o by a forming step at another horizontal position (at another level) to form another layer of conductive wire 30 and this layer is called an upper-layer conductive wire 30b. And a rear-end solder point 31 of each conductive wire 30 (30b, 30c) is exposed outside the dielectric layer 20 (exposed on the outermost layer of the dielectric layer). Thus each solder point 31 exposed on the surface of the dielectric layer 20 is electrically connected with each bonding pad 11 on the die 10. By double-layer (the upper and lower layers) conductive wire 30 (30b, 30c), the wiring space on pad-mounting surface of the die is used more efficiently.

Refer from FIG. 4A to FIG. 4N, manufacturing processes of the chip package 2 of this embodiment, especially formation of the upper layer and lower layer of conductive wire 30b, 30c, includes following steps:

As shown in FIG. 4A, a die 10 is used as an example. Generally, the die 10 is arranged with a plurality of bonding pads 11. In this embodiment, two adjacent bonding pads 11 (the left side), 11' (the right side) on the die 10 are used as an example, but not intended to limit the present invention. Moreover, the bonding pads 11, 11' are projected from or parallel to (as shown in figure) the pad-mounting surface 12 of the die 10, but not only limited to these arrangements. This step is similar to the step in FIG. 2A.

Refer to FIG. 4B, similar to the step in FIG. 2B, at a first dielectric layer 20a is coated on the pad-mounting surface 12 of the die 10.

Refer to FIG. 4C, as the step in FIG. 2C, a slot 21 corresponding to each bonding pad 11, 11' is formed on the first dielectric layer 20a so that each bonding pad 11, 11' is exposed.

Refer to FIG. 4 D, similar to the step in FIG. 2D, the exposed bonding pad 11, 11' in each slot 21 respectively are coated with an electrically conductive metal layer such as nickel-gold materials etc. by Electroless Nickel/Immersion Gold (ENIG) plating.

Refer to FIG. 4E, similar to the steps in FIG. 2E and FIG. 2F, both the first dielectric layer 20a and the protective layer 11a are coated with a second dielectric layer 20b. Then a wiring slot 22 connected with each bonding pad 11, 11' and the slot 21 thereof or part thereof is formed on the second dielectric layer 20b. In this embodiment, the wiring slot 22 is formed on part of the bonding pad 11' (on the right side in the figure) and the slot thereof while the other bonding pad 11 and the slot 21 thereof are only with a slot 21 (the extension of the original slot 21) so as to reduce the space occupied by the slot 21 on the second dielectric layer 20b. Thereby the wiring space on the on the pad-mounting surface 12 is used more efficiently. By reducing the space occupies by each slot 21, the wiring space of each wiring slot 22 is increased. Moreover, each wiring slot 22 and each slot 21 are mounted concavely in the 2nd dielectric layer 20b.

Refer to FIG. 4F, as the step shown in FIG. 2G, a lower-layer conductive wire 30b is formed on each wiring slot 22 and each slot 21 respectively.

Refer to FIG. 4G, similar to the step in FIG. 2I, each 2nd dielectric layer 20b and each conductive wire 30b respectively are coated with a third (3rd) dielectric layer 20c.

Refer to FIG. 4H, similar to the rear-stage of the step in FIG. 2I, a slot 21 connected with one end of each conductive wire 30b is formed on the 3rd dielectric layer 20c.

Refer to FIG. 4I, similar to the front-stage of the step in FIG. 4E, the 3rd dielectric layer 20c and each slot 21 are coated with a fourth (4th) dielectric layer 20d.

Refer to FIG. 4J, similar to the rear-stage of the step in FIG. 4E, a wiring slot 22 as well as a slot 21 connected with one end of each conductive wire 30b are respectively formed on the 4th dielectric layer 20d. In this embodiment, only one slot 21 is formed on part of the conductive wire 30b (the conductive wire 30b that connects with the bonding pad 11' on the right side in the figure) and this slot 21 is extended from the original slot 21 in FIG. 4H. Thus the space occupied by the slot 21 on the 4th dielectric layer 20d is reduced. As to the rest part of the conductive wire 30b (the conductive wire 30b that connects with the bonding pad 11 on the left side in the figure), a wiring slot 22 is formed thereabove. Thereby the wiring space on the 4th dielectric layer 20d can be used more efficiently.

Refer to FIG. 4K, similar to the step in FIG. 2G, or FIG. 4F, an upper-layer conductive wire 30c is formed respectively on each wiring slot 22 and each slot 21 of the 4th dielectric layer 20d.

Refer to FIG. 4L, as the step shown in FIG. 2H, each upper-layer conductive wire 30c is coated with an electrically conductive metal layer such as nickel silver materials etc by y Electroless Nickel/Immersion Gold (ENIG) plating.

Refer to FIG. 4M, similar to the step in FIG. 2E, or FIG. 2F, again, coat a fifth (5th) dielectric layer 20e on the 4th dielectric layer 20d and each upper-layer conductive wire 30c (with the protective layer 30a) respectively. A slot 23 connected with one end of each upper-layer conductive wire 30c is formed on the 5th dielectric layer 20e.

Refer to FIG. 4N, a respective solder point 31 is formed on each slot 23 of the 5th dielectric layer 20e, exposed outside the dielectric layer 20 (5th dielectric layer 20e). Thus each solder point 31 is electrically connected with each bonding pad 11, 11' of the die 10. Each solder point 31 and the conductive wires 30b, 30c connected therewith constitutes a conductive wiring on the pad-mounting surface 12 of the die 10 of the chip package 2. On end of each conductive wire 30 (30b, 30c) is electrically connected with one bonding pad 11 (11') on the die 10 while the other end thereof extends outwards and exposes outside the dielectric layer 20 to form a solder point 31. Thus each solder point 31 is electrically connected with both each bonding pad 11 (11') on the die 10 and a solder point preset on a substrate (not shown in figure) so as to assemble and fix the die 10 on the substrate. Moreover, the shape of the solder point 31 is semispheric but not limiting, projecting out of the outer surface of the dielectric layer 20 (the 5th dielectric layer 20e), as shown in FIG. 4N or in FIG. 3. Or the solder point 31 may be a flat metal layer parallel with the outer surface of the 5th dielectric layer 20e, as the dotted line indicated in FIG. 1.

Refer to FIG. 3 and FIG. 4A to FIG. 4N, when the pad-mounting surface 12 of the die 10 is disposed with a number N of bonding pads 11, 11', there are a number N of separated (insulated) conductive wires 30 formed on the dielectric layer 20. In this embodiment, the number N of conductive wires 30 are divided into two parts-lower-layer conductive wire 30b and upper-layer conductive wire 30c. A solder point 31 on the rear-end of each conductive wire 30 (30b, 30c) is exposed outside the dielectric layer 20 (the outermost layer of the dielectric layer). Thus one end of the number N of conductive wires 30 (30b, 30c) is electrically connected with each bonding pad 11, 11' on the die 10 while the other end thereof extends and exposes outside the surface of the dielectric layer 20 to form separated number N of solder points 31 so as to be electrically connected with a number N of solder points preset on a substrate (not shown in figure). In this embodiment, the dielectric layer 20 is formed by the 1st, 2nd, 3rd, 4th, and 5th dielectric layers 20a, 20b, 20c, 20d and 20e. And the thickness of each dielectric layer 20a-20e is not limited and is set according to requirements of structure or requirements of the manufacturing equipment. Furthermore, each conductive wire 30 (39b, 30c) is disposed on the dielectric layer 20 at two different levels, as shown in FIG. 3 and FIG. 4N. That means each conductive wire 30(30b, 30c) is located at different heights. Thus such design is considered as a double-layer structure of the conductive wire.

The manufacturing processes of the chip package structure 1, 2 according to the present invention, especially the forming steps of each conductive wire 30 (30b, 30c), are with certain precision. Moreover, according to the same forming processes, an upper and a lower layer (double-layer) structure of the conductive wire is formed so as to improve the use efficiency of the wiring space on the pad-mounting surface of the die. Therefore, the use efficiency of the wafer is further increased and the yield rate of the packaging process is dramatically improved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

The invention claimed is:

1. A method for forming the conductive wire of a chip scale package, the chip scale package that is assembled on a substrate and is electrically connected with a plurality of solder points arranged at the substrate comprising: a die having a pad-mounting surface disposed with a plurality of bonding pads; at least one dielectric layer covered over the pad-mounting surface of the die; and at least one conductive wire arranged in the dielectric layer and one end of each conductive wire is electrically connected with one bonding pad of the die while the other end of the conductive wire extends outward and exposes outside surface of the dielectric layer to form a solder point that is electrically connected with a preset solder point on a substrate for connecting and assembling the die on the substrate; the method for forming the conductive wire of a chip scale package comprising the following steps:

step 1: coating a first dielectric layer on the pad-mounting surface of the die;

step 2: forming a slot on the first dielectric layer by exposure and development of photoresist materials while the slot corresponding to each bonding pad on the pad-mounting surface so that each bonding pad is exposed through each slot;

step 3: coating an electrically conductive metal layer of nickel-gold materials by electroless nickel/immersion gold (ENIG) plating on each bonding pad in the slot;

step 4: coating a second dielectric layer on the first dielectric layer and the conductive metal layer of nickel-gold materials of each bonding pad;

step 5: forming a wiring slot on the second dielectric layer by exposure and development of photoresist materials while the wiring slot connects with each bonding pad and the slot of the bonding pad; each wiring slot is mounted concavely in the second dielectric layer;

step 6: filling silver paste into each wiring slot by silver paste printing to form a respective conductive wire;

step 7: removing by grinding the silver paste over the surface of the second dielectric layer so as to make the surface of the silver paste conductive wire formed and the surface of the second dielectric layer at the same level;

step 8: coating an electrically conductive metal layer of nickel silver materials on each conductive wire;

step 9: coating a third dielectric layer on the second dielectric layer and the electrically conductive metal layer of nickel silver materials of each conductive wire;

step 10: forming a slot on the third dielectric layer by exposure and development of photoresist materials and the slot connected with one end of each conductive wire; and step 11: filling electrically conductive metal into each slot to form a respective solder point that is exposed outside the third dielectric layer to be electrically connected with each bonding pad of the die.

2. The method for forming the conductive wire of a chip scale package as claimed in claim 1, wherein the first dielectric layer, the second dielectric layer, and the third dielectric layer are coated by spin coating.

3. The method for forming the conductive wire of a chip scale package as claimed in claim 1, wherein the solder point exposed outside the dielectric layer is a hemisphere, projecting out of the dielectric layer.

4. A method for forming the conductive wire of a chip scale package, the chip scale package that is assembled on a substrate and is electrically connected with a plurality of solder points arranged at the substrate comprising: a die having a pad-mounting surface disposed with a plurality of bonding pads; at least one dielectric layer covered over the pad-mounting surface of the die; and at least one conductive wire arranged in the dielectric layer and one end of each conductive wire is electrically connected with one bonding pad of the die while the other end of the conductive wire extends outward and exposes outside surface of the dielectric layer to form a solder point that is electrically connected with a preset solder point on a substrate for connecting and assembling the die on the substrate; the method for forming the conductive wire of a chip scale package comprising the following steps:

step 1: coating a first dielectric layer on the pad-mounting surface of the die;

step 2: forming a slot on the first dielectric layer by exposure and development of photoresist materials while the slot corresponding to each bonding pad on the pad-mounting surface so that each bonding pad is exposed through the slot;

step 3: coating an electrically conductive metal layer of nickel-gold materials by electroless nickel/immersion gold (ENIG) plating on each bonding pad in the slot;

step 4: coating a second dielectric layer on the first dielectric layer and the conductive metal layer of nickel-gold materials of each bonding pad;

step 5: forming a wiring slot or a slot on the second dielectric layer by exposure and development of photoresist materials while the wiring slot or the slot connects with each bonding pad and the slot of the bonding pad; part of the bonding pad and the slot thereof forms a wiring slot and the rest part of the bonding pad and the slot thereof forms a slot while each wiring slot and each slot are mounted concavely in the second dielectric layer;

step 6: filling silver paste into each wiring slot and each slot by silver paste printing to form a lower-layer conductive wire respectively;

step 7: removing by grinding the silver paste over the surface of the second dielectric layer so as to make the surface of the silver paste conductive wire formed and the surface of the second dielectric layer at the same level;

step 8: coating a third dielectric layer on the second dielectric layer and each lower-layer conductive wire;

step 9: forming a slot on the third dielectric layer by exposure and development of photoresist materials and the slot connected with one end of each lower-layer conductive wire;

step 10: coating a fourth dielectric layer on the third dielectric layer and each slot;

step 11: forming a wiring slot or a slot on the fourth dielectric layer by exposure and development of photoresist materials and the wiring slot or the slot connected with one end of each lower-layer conductive wire; part of the lower-layer conductive wire forms a slot when the part of the lower-layer conductive wire is a wiring slot in the second dielectric layer while the rest part of the lower-layer conductive wire forms a slot wiring when the part of the lower-layer conductive wire is a slot in the second dielectric layer; wherein each wiring slot and each slot are mounted concavely in the fourth dielectric layer;

step 12: filling silver paste into each wiring slot and each slot by silver paste printing to form an upper-layer conductive wire respectively;

step 13: removing by grinding the silver paste over the surface of the fourth dielectric layer so as to make the surface of the silver paste conductive wire formed and the surface of the fourth dielectric layer at the same level;

step 14: coating an electrically conductive metal layer of nickel silver materials on each upper-layer conductive wire;

step 15: coating a fifth dielectric layer on the fourth dielectric layer and the electrically conductive metal layer of nickel silver materials of each upper-layer conductive wire;

step 16: forming a slot on the fifth dielectric layer by exposure and development of photoresist materials and the slot connected with one end of each upper-layer conductive wire; and step 17: filling electrically conductive metal into each slot on the fifth dielectric layer to form a respective solder point that is exposed outside the fifth dielectric layer to be electrically connected with each bonding pad of the die.

5. The method for forming the conductive wire of a chip scale package as claimed in claim 4, wherein the first dielectric layer, the second dielectric layer, the third dielectric layer, the fourth dielectric layer, and the fifth dielectric layer are coated by spin coating but not limiting.

6. The method for forming the conductive wire of a chip scale package as claimed in claim 4, wherein the solder point exposed outside the dielectric layer is a hemisphere, projecting out of the dielectric layer.

* * * * *